United States Patent
Jafri et al.

(10) Patent No.: US 8,453,312 B2
(45) Date of Patent: *Jun. 4, 2013

(54) METHOD OF MANUFACTURING VIBRATING MICROMECHANICAL STRUCTURES

(75) Inventors: Ijaz H. Jafri, Woodinville, WA (US); Jonathan L. Klein, Redmond, WA (US); Galen P. Magendanz, Issaquah, WA (US)

(73) Assignee: Honeywell International Inc., Morristown, NJ (US)

( * ) Notice: Subject to any disclaimer, the term of this patent is extended or adjusted under 35 U.S.C. 154(b) by 1325 days.

This patent is subject to a terminal disclaimer.

(21) Appl. No.: 12/164,300

(22) Filed: Jun. 30, 2008

(65) Prior Publication Data

US 2008/0261372 A1 Oct. 23, 2008

Related U.S. Application Data

(62) Division of application No. 11/084,978, filed on Mar. 21, 2005, now Pat. No. 7,406,761.

(51) Int. Cl.
*H04R 31/00* (2006.01)
*H01L 21/311* (2006.01)

(52) U.S. Cl.
USPC .............. 29/594; 216/52; 216/66; 216/83; 438/700; 438/737

(58) Field of Classification Search
USPC ... 438/107, 118, 691, 700, 737, 48; 29/25.35, 29/594, 852; 359/290; 333/197–199; 216/66, 216/52, 83
See application file for complete search history.

(56) References Cited

U.S. PATENT DOCUMENTS

| | | | |
|---|---|---|---|
| 6,249,073 B1 | 6/2001 | Nguyen et al. |
| 6,296,779 B1 | 10/2001 | Clark et al. |
| 6,424,074 B2 | 7/2002 | Nguyen |
| 6,433,401 B1 | 8/2002 | Clark et al. |
| 6,490,147 B2 | 12/2002 | Yoon et al. |
| 6,566,786 B2 | 5/2003 | Nguyen |
| 6,569,754 B2 | 5/2003 | Wong et al. |
| 6,577,040 B2 | 6/2003 | Nguyen |
| 6,593,831 B2 | 7/2003 | Nguyen |
| 6,600,252 B2 | 7/2003 | Nguyen |
| 6,628,177 B2 | 9/2003 | Clark et al. |
| 6,667,558 B2 | 12/2003 | Wong et al. |
| 6,680,660 B2 | 1/2004 | Nguyen |

(Continued)

FOREIGN PATENT DOCUMENTS

JP 06120416 A * 4/1994 ............... 29/25.35 X

*Primary Examiner* — A. Dexter Tugbang
(74) *Attorney, Agent, or Firm* — Lowe Graham Jones PLLC

(57) ABSTRACT

A method for fabrication of single crystal silicon micromechanical resonators using a two-wafer process, including either a Silicon-on-insulator (SOI) or insulating base and resonator wafers, wherein resonator anchors, a capacitive air gap, isolation trenches, and alignment marks are micromachined in an active layer of the base wafer; the active layer of the resonator wafer is bonded directly to the active layer of the base wafer; the handle and dielectric layers of the resonator wafer are removed; viewing windows are opened in the active layer of the resonator wafer; masking the single crystal silicon semiconductor material active layer of the resonator wafer with photoresist material; a single crystal silicon resonator is machined in the active layer of the resonator wafer using silicon dry etch micromachining technology; and the photoresist material is subsequently dry stripped.

7 Claims, 8 Drawing Sheets

U.S. PATENT DOCUMENTS

| | | |
|---|---|---|
| 6,713,938 B2 | 3/2004 | Nguyen |
| 6,739,190 B2 | 5/2004 | Hsu et al. |
| 6,816,035 B2 * | 11/2004 | Ma et al. .................. 29/25.35 X |
| 7,202,560 B2 | 4/2007 | Dungan et al. |
| 7,407,826 B2 * | 8/2008 | Jafri et al. ....................... 438/48 |
| 2003/0020565 A1 | 1/2003 | Cornett et al. |
| 2003/0039021 A1 * | 2/2003 | Ton ............................... 359/290 |
| 2004/0065638 A1 | 4/2004 | Gogoi |
| 2005/0037534 A1 | 2/2005 | Sawyer |

* cited by examiner

METHOD OF MANUFACTURING VIBRATING MICROMECHANICAL STRUCTURES

PRIORITY CLAIM

This patent application claims priority from U.S. patent application Ser. No. 11/084,978 filed Mar. 21, 2005, and entitled, "Method of Manufacturing Vibrating Micromechanical Structures," now U.S. Pat. No. 7,406,761, issued on Aug. 5, 2008, the contents of which are hereby incorporated by reference in its entirety.

BACKGROUND OF THE INVENTION

The present invention relates to methods of fabricating micromechanical resonators using Silicon-on-insulator (SOI) wafers, and in particular to methods of fabricating micromechanical resonators using single crystal silicon wafer material.

As disclosed by Yoon, et al. in U.S. Pat. No. 6,490,147, "High-Q Micromechanical Device and Method of Tuning Same," Dec. 3, 2002, which is incorporated herein by reference, and also by Nguyen, et al. in U.S. Pat. No. 6,249,073, "Device Including a Micromechanical Resonator Having an Operating Frequency and Method of Extending Same," Jun. 19, 2001, which is incorporated herein by reference, vibrating micromechanical resonators formed of polycrystalline silicon, commonly known as polysilicon, are well-known as miniaturized substitutes for crystals in a variety of high-Q oscillator and filtering applications. State of the art micromechanical resonator fabrication techniques utilize polycrystalline silicon for manufacturing micromechanical resonators devices produced by means of silicon sacrificial surface micromachining.

This state of the art method of manufacturing using sacrificial surface micromachining produces polysilicon resonators or other thin film resonators having intrinsic stresses, stress gradients, or both, that effect device performance. These intrinsic stresses and stress gradients are difficult to control during manufacturing. Yet, control of these intrinsic stresses and stress gradients is critical for devices for use in applications that require high repeatability and reproducibility.

This state of the art method of manufacturing using polysilicon also requires removal of a sacrificial layer of material using wet etching techniques that complicate the manufacturing process and generally results in low yield due to difficulty in removing sacrificial material in the small gap between the resonator and the lower electrode. This method of manufacturing using polycrystalline silicon also results in stiction, which further lowers yields.

For devices requiring very small capacitive air gaps, e.g., to compensate for manufacturing tolerances or for tuning or for use as tunable resonator cum filter, the removal of sacrificial layer becomes extremely difficult as liquid or even vapor etching techniques cannot easily penetrate underneath the resonators to create a free standing structures. The removal of etched sacrificial material to form the capacitive gap is a process as well as operation yield limiter for small air gaps on the order of 300 Angstrom or smaller.

Additionally, impurities present in polysilicon thin films degrade device performance and also result in lower resonator Q.

FIGS. 1 and 2 present conceptual and perspective view schematics, respectively, of a tunable capacitor 10 as taught by Yoon, et. al. in U.S. Pat. No. 6,490,147. The capacitor 10 has a bottom capacitor plate 12 fixed to a substrate 14, and a top capacitor plate 16 suspended above the bottom plate 12. The top capacitor plate 16 is also anchored to the substrate 14. Both plates 12 and 16 are constructed of copper (Cu) to minimize their total series resistance in an attempt to maximize the device quality factor, Q.

A dielectric slab 18 is suspended between the two plates 12 and 16 and anchored to the substrate 14 outside the two plates 12 and 16 via spring structures 20. This dielectric 18 is free to move by electrostatic displacement to alter either the overlap between it and the capacitor plates 12 and 16, or the fringing fields between them. In the former case, when a DC bias is applied between the two plates 12 and 16, the charges on the capacitor plates 12 and 16 exert an electrostatic force on the induced charges in the dielectric 18 to pull the dielectric 18 into the gap between the plates 12 and 16, as shown in FIG. 1. The "waffle" shape of the capacitor 10 shown in FIG. 2 is intended to minimize the travel distance, or the needed voltage, required for a given change in capacitance, and to provide etchant access paths during a step in the fabrication process for removing a thin sacrificial layer by etching.

FIGS. 3A-3E are side sectional views which illustrate one state of the art fabrication process for producing micromechanical resonators of the type depicted by the capacitor 10. The prior art process, as taught by Yoon, et. al. in U.S. Pat. No. 6,490,147, begins in FIG. 3A with the thermal growth of a 1 micron layer 30 of $SiO_2$ to serve as an isolation or dielectric layer between the eventual metal structures and a silicon wafer or substrate 32. Next, the bottom capacitor plate 12 is formed by first evaporating 300 Angstroms/2000 Angstroms a Cr/Cu seed layer 34, then electroplating a 5 micron layer 36 of copper (Cu). A 3000 Angstrom layer 38 of nickel (Ni) is then electroplated above the Cu layer 36 to serve as a buffer layer to prevent Cu contamination of etch chambers during subsequent reactive ion etch (RIE) processes.

FIG. 3B illustrates a first 2000 Angstrom aluminum (Al) sacrificial layer 40 is evaporated and patterned to form vias through which a subsequent layer PECVD nitride dielectric film 42 adheres to the underlying Ni layer 38. The nitride film 42 is patterned via RIE to form the movable dielectric plate 18, then submerged under 0.9 micron of a second sacrificial Al film 44 that defines the spacing between the dielectric plate 18 and the eventual top metal plate 16, as shown in FIG. 3C. Due to the valley-like topography between the fingers of the etched dielectric, the deposition of the 0.9 micron layer 44 of Al actually results in only a 0.3 micron gap between the top plate 16 and the dielectric 18 when the two are engaged.

After etching vias through the Al layer 44 to define top plate anchors (shown in FIG. 3C), as shown in FIG. 3D, the top plate 16 is formed by first evaporating a thin Cr/Cu seed layer 46, then electroplating a Cu layer 48 through a defining photoresist mold 50 to a thickness sufficient to insure that the top plate 16 does not bend under applied actuation voltages. The PR and seed layer under the PR are removed. The two Al sacrificial layers 40 and 44 are selectively etched to release the dielectric 42 using a $K_3Fe(CN)_6$/NaOH solution, which attacks Al, but leaves Cu and the nitride dielectric 42 intact, yielding the final cross-section shown in FIG. 3E. After release, sublimation or a critical point dryer is often used to dry the capacitor 10 in an attempt to prevent stiction.

Additionally, cleaning and removal of the sacrificial layer is extremely difficult for small gaps, and often requires use of a surfactant.

FIG. 4 illustrates a perspective view schematic of a free-free beam, flexural-mode, micromechanical device or resonator 52 and an electrical pick off scheme, as taught by Nguyen, et. al. in U.S. Pat. No. 6,249,073. The device 52 includes a free-free micromechanical flexural resonator beam 54 supported at its flexural nodal points 56 by four torsional beams 58, each anchored to a substrate 59 by rigid contact anchors 60. A drive electrode 62 underneath the free-free resonator beam 54 allows electrostatic excitation via an applied AC voltage Vi, and output currents are detected directly off a DC-biased (via V.sub.P) resonator structure 64. The torsional support beams 58 are designed with quarter-wavelength dimensions, which effect an impedance transformation that isolates the free-free resonator beam 54 from the rigid anchors 60. Ideally, the free-free resonator beam 54 sees zero-impedance into its supports or beams 58, and thus, effectively operates as if levitated without any supports. As a result, anchor dissipation mechanisms normally found in previous clamped-clamped beam resonators are greatly suppressed, allowing much higher device Q. However, multiple drive electrodes may be utilized for push-pull excitation. The electrodes can also be used for sensing, frequency tuning and detection of the output.

Typically, a transducer capacitor gap spacing is entirely determined via a sacrificial surface micromachining process for removing a thin sacrificial oxide layer, and wet etching of the sacrificial layer for final release of the flexural resonator beam 54 to create the capacitor gap.

FIGS. 5A and 5B illustrate a transducer capacitor gap spacing, as taught by Nguyen, et al. in U.S. Pat. No. 6,249,073, that is not entirely determined via a thin sacrificial oxide, as was done (with difficulty) in previous clamped-clamped beam high frequency devices. Rather, as taught by Nguyen, et al., the capacitor gap 66 is determined by the height of spacers or dimples 68 set by a timed etch. The height of the dimples 68 is such that when a sufficiently large DC-bias V.sub.P is applied between the drive electrode 62 and the resonator beam 54, the whole structure comes down and rests upon the dimples 68, which are located at the flexural nodal points 56. The spacers 68 are formed either on the resonator beam 54 or on the substrate 59.

As taught by Nguyen, et al. in U.S. Pat. No. 6,249,073, the use of dimples to set the capacitor gap spacings 66 is intended to permit much thicker sacrificial oxide spacers to be used, thereby alleviating previous problems due to pinholes and non-uniformity in ultra-thin sacrificial layers used when transducer capacitor gap spacing is entirely determined by sacrificial surface micromachining for removing the thin sacrificial oxide. Also, the thicker sacrificial oxide is intended to be easier to remove than previous thinner ones, which is intended to decrease the required HF release etch time and lessen the probability that etching by-products remain in the gap 66 where they might interfere with resonator operation and Q.

FIGS. 6A, 6B and 6C illustrate one state of the art fabrication method for producing micromechanical resonators as taught by Nguyen, et al. in U.S. Pat. No. 6,249,073, wherein the device 52 is fabricated using a five-mask, polycrystalline silicon or "polysilicon," surface-micromachining technology described by the process flow shown in U.S. Pat. No. 6,249,073. The fabrication sequence taught by Nguyen, et al. begins with isolation layers 70 and 72 formed via successive growth and deposition of 2 micron thermal oxide and 2000 Angstrom LPCVD Si.sub.3N.sub.4, respectively, over a <100> lightly-doped p-type starting silicon wafer 74. Next, 3000 Angstroms of LPCVD polysilicon is deposited at 585 degrees C. and phosphorous-doped via implantation, then patterned to form the ground planes 64 and interconnects. An LPCVD sacrificial oxide layer 78 is then deposited to a mathematically determined thickness, after which successive masking steps produce dimple and anchor openings 80, 82. The dimple openings 82 are defined via a reactive-ion etch which must be precisely controlled. Anchors openings 80 are simply wet-etched in a solution of buffered hydrofluoric acid (BHF).

Next, in FIG. 6B, structural polysilicon is deposited via LPCVD at 585 degrees C., and phosphorous dopants are introduced via ion-implantation to provide the flexural resonator beam 54. A 2000 Angstrom-thick oxide mask is then deposited via LPCVD at 900 degrees C., after which the wafers must be annealed for one hour at 1000 degrees C. in an effort to relieve stress and distribute dopants.

As illustrated in FIG. 6C, wet etching of the sacrificial layer is used for final release of the flexural resonator beam 54 to create the capacitor gap 66. Both the oxide mask and structural layer are patterned via SF.sub.6/O.sub.2 and Cl.sub.2-based RIE etches, respectively. The structures 54 and 58 are then released via a 5 minute etch in 48.8 wt. % HF. As taught by Nguyen, et al. in U.S. Pat. No. 6,249,073, this 5 minute release etch time is significantly shorter than that required for previous clamped-clamped beam resonators, which is about 1 hour, because they did not benefit from the dimple-activated gap spacings, as taught by Nguyen, et al. The previous clamped-clamped beam resonators require sacrificial oxide thicknesses on the order of hundreds of Angstroms. After structural release by wet etching of the sacrificial layer, aluminum is evaporated and patterned over polysilicon interconnects via lift-off to reduce series resistance.

Thus, state of the art methods of manufacturing using polycrystalline silicon produces resonators having intrinsic stresses, stress gradients, or both, that effect device performance. These state of the art methods of manufacturing using polycrystalline silicon also require removal of a sacrificial layer of material using wet etching techniques that complicate the manufacturing process and generally results in low yield due to difficulty in removing sacrificial material in the small gap between the resonator and the lower electrode. This method of manufacturing using polycrystalline silicon also results in stiction, which further lowers yields, and impurities present in polysilicon thin films degrade device performance and result in lower resonator Q.

Thus, an improved device and method of manufacturing are desirable.

SUMMARY OF THE INVENTION

A method for fabrication of single crystal silicon (SCS) micromechanical resonators using a two-wafer process, including a Silicon-on-Insulator (SOI) or an insulating base wafer and a SOI resonator wafer, wherein resonator anchors, a capacitive air gap, isolation trenches, transmission lines, and alignment marks are micromachined in a single crystal silicon semiconductor material active layer of the base SOI wafer. When practiced using an insulating wafer, such as glass, Pyrex, quartz, or oxided silicon, alignment marks, capacitive air gap, transmission lines, and resonator anchors are fabricated on the insulating wafer using a combination of bulk and surface micromachining and metal deposition and etching. The single crystal silicon semiconductor material active layer of the resonator wafer is bonded directly to the active layer of the base wafer using wafer flat for alignment. The handle and dielectric layers of the resonator wafer are removed. According to one aspect of the invention, viewing windows are opened in the active layer of the resonator wafer to access alignment marks in the active layer of base wafer. Alternatively, alignment is accomplished using a conventional double sided aligner. The SCS semiconductor material active layer of the resonator wafer is masked with photoresist material; and a single crystal silicon resonator is fabricated in the single crystal silicon semiconductor material active layer of the resonator wafer using silicon dry etch micromachining technology, such as reactive ion etching (RIE) or deep reactive ion etching (DRIE). The photoresist material is subsequently removed by dry stripping.

According to one aspect of the invention, alignment for bonding the single crystal silicon (SCS) semiconductor material active layer of the resonator wafer with base wafer is accomplished using only wafer flat alignment of the two or more stacked wafers.

According to another aspect of the invention, alignment for bonding the single crystal silicon (SCS) semiconductor material active layer of the resonator wafer with the base wafer is accomplished using double sided aligner.

According to another aspect of the invention, the resonator beam anchors, capacitive air gap, transmission lines, isolation trenches, and alignment marks are machined in the active layer of the base SOI wafer further using a conventional photolithography masking and dry etching micromachining method.

According to yet another aspect of the invention, the resonator beam anchors, capacitive air gap, transmission lines, isolation trenches, and alignment marks are machined on an insulating substrate, such as Pyrex, glass, quartz, oxidized silicon, or nitride, using etching of the insulating layer and metal deposition to create these features.

According to another aspect of the invention, the two wafers are bonded by 10 fusion bonding, anodic bonding or frit bonding methods.

According to another aspect of the invention, silicon dry etch machining the single crystal silicon resonator beam in the single crystal silicon semiconductor material active layer of the resonator wafer produces a single crystal silicon clamped-clamped resonator beam.

According to another aspect of the invention, silicon dry etch machining the single crystal silicon resonator beam in the single crystal silicon semiconductor material active layer of the resonator wafer produces a single crystal silicon clamped-free resonator beam.

According to another aspect of the invention, silicon dry etch machining the single crystal silicon resonator beam in the single crystal silicon semiconductor material active layer of the resonator wafer produces a single crystal silicon free-free resonator beam.

According to another aspect of the invention, silicon dry etch machining the single crystal silicon resonator beam in the single crystal silicon semiconductor material active layer of the resonator wafer produces a single crystal silicon membrane or disk.

According to another aspect of the invention, the single crystal silicon clamped-clamped resonator beam is an interconnected dual resonator that is structured to form a filter device.

According to one aspect of the invention, the single crystal silicon wafer mechanical resonator is structured as a clamped-clamped interconnected dual beam resonator for operation as filter.

According to one aspect of the invention, the single crystal silicon wafer mechanical resonator is structured as a clamped-free interconnected dual beam resonator for operation as filter.

According to one aspect of the invention, the single crystal silicon wafer mechanical resonator is structured as a free-free interconnected dual beam resonator for operation as filter.

According to one aspect of the invention, the single crystal silicon wafer mechanical resonator is structured as a one disk or multidisk interconnected resonator for operation as filter.

According to other aspects of the invention, an improved micromechanical resonator structured of single crystal silicon wafer material is provided using the method of the present invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

In the Figures, like numerals indicate like elements.

The present invention is an apparatus and method for fabrication of micromechanical resonators using a two-wafer process, including a Silicon-on-Insulator (SOI) base wafer and a SOI resonator wafer, or alternatively an insulating base wafer and a single crystal silicon (SCS) or SOI resonator wafer.

Figure 1:
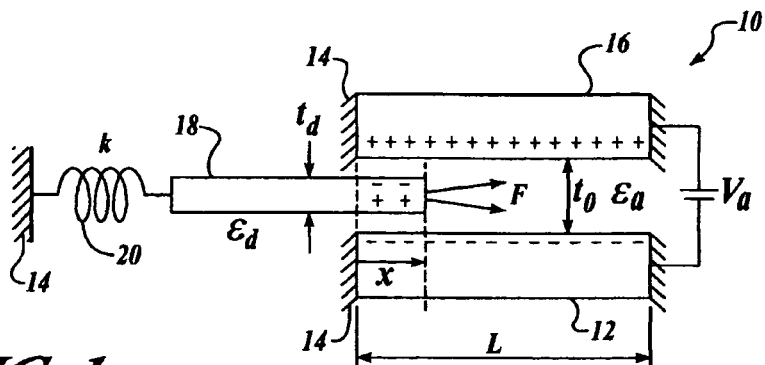
FIGS. 1 and 2 present conceptual and perspective view schematics, respectively, of a state of the art tunable capacitor as taught by Yoon, et al. in U.S. Pat. No. 6,490,147.
Figure 2:
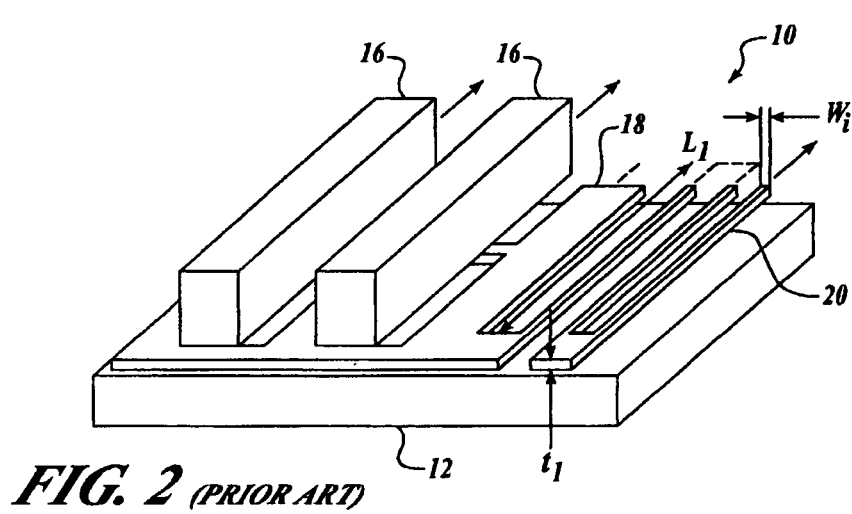
Figure 3A:
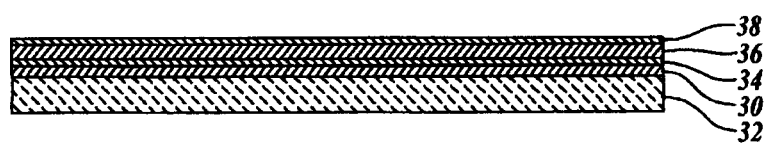
FIGS. 3A-3E are side sectional views which illustrate one state of the art fabrication process of the prior art used for the capacitor illustrated in FIGS. 1 and 2, as taught Yoon, et al. in U.S. Pat. No. 6,490,147.
Figure 3B:
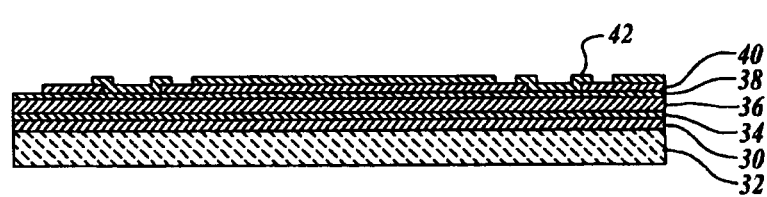
Figure 3C:
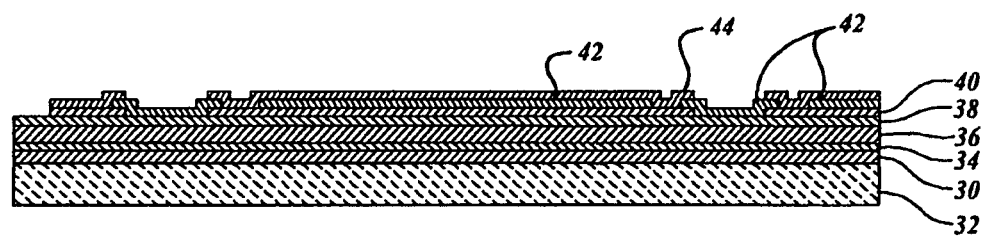
Figure 3D:
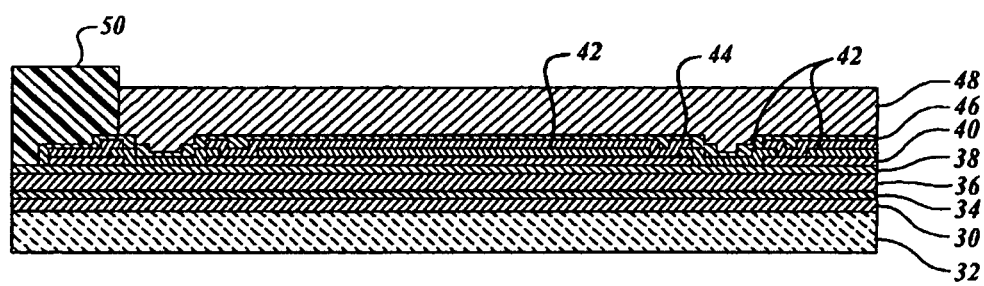
Figure 3E:
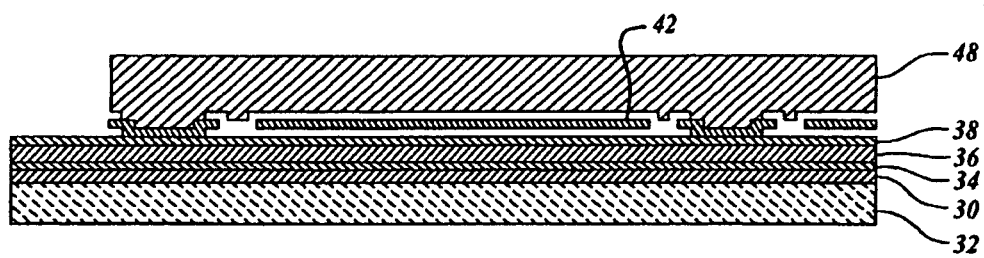
Figure 4:
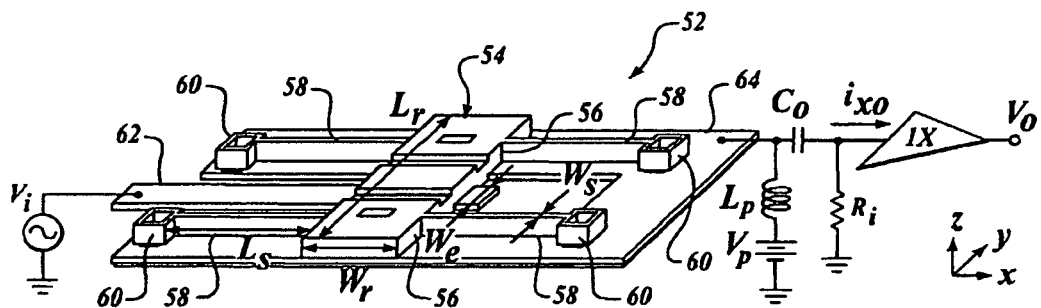
FIG. 4 illustrates a perspective view schematic of a state of the art free-free beam, flexural-mode, micromechanical device or resonator and an electrical pick off scheme, as taught by Nguyen, et al. in U.S. Pat. No. 6,249,073.
Figure 5A:
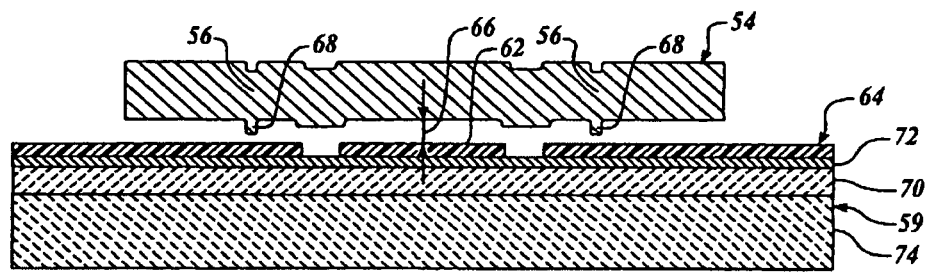
FIGS. 5A and 5B illustrate a state of the art transducer capacitor gap spacing, as taught by Nguyen, et al. in U.S. Pat. No. 6,249,073.
Figure 5B:
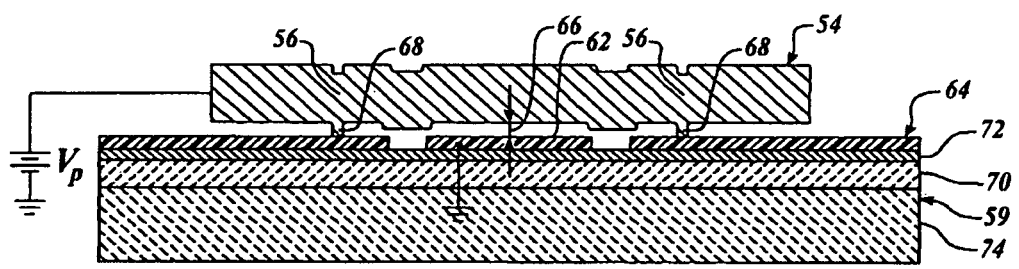
Figure 6A:
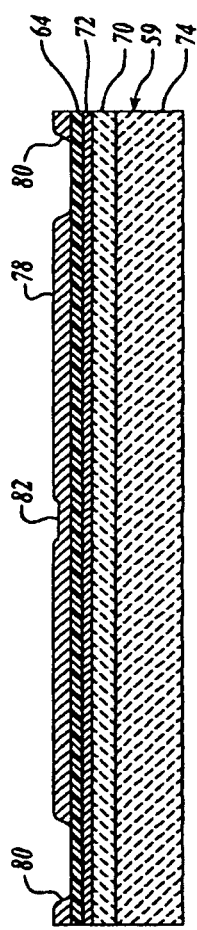
FIGS. 6A, 6B and 6C illustrate one state of the art fabrication method using a five-mask, polysilicon, surface-micromachining technology described by the process flow, as taught by Nguyen, et al. in U.S. Pat. No. 6,249,073.
Figure 6B:
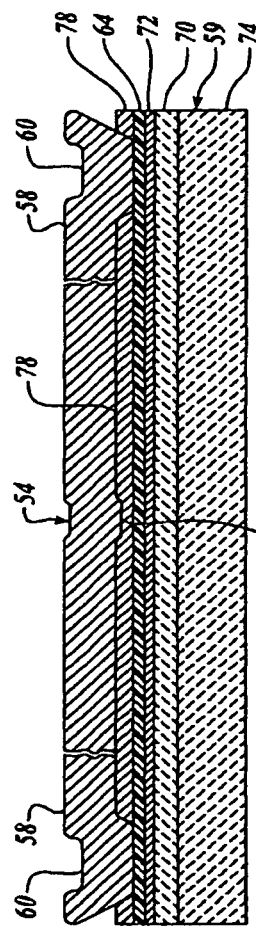
Figure 6C:
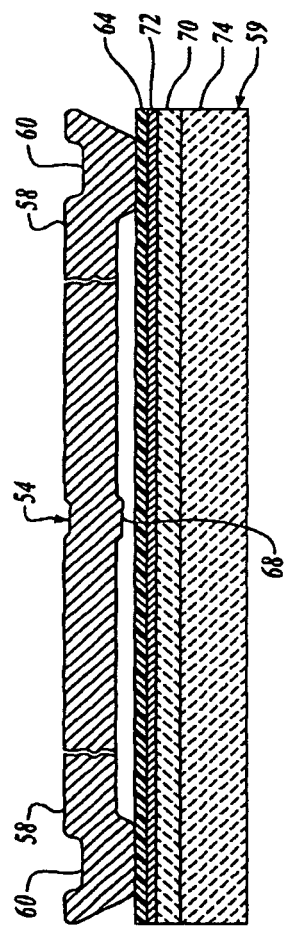
Figure 7:
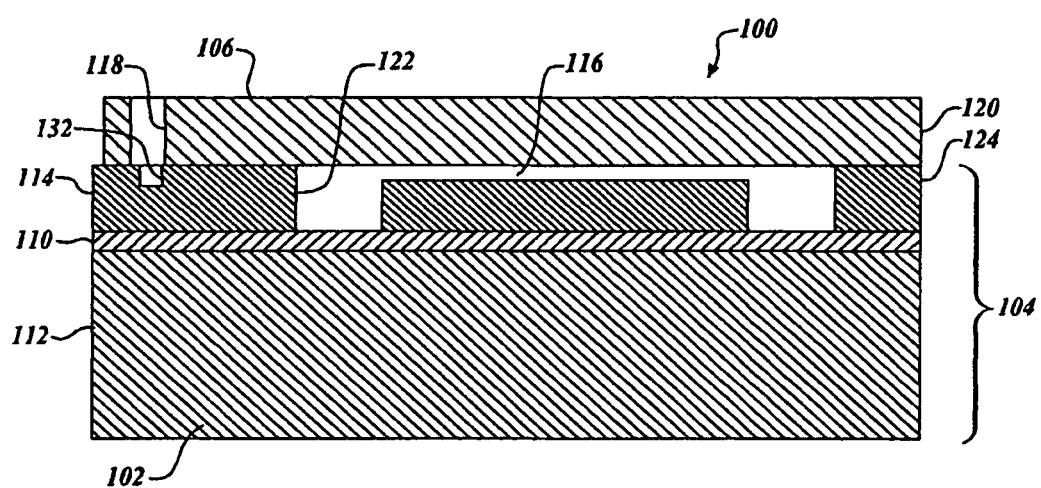
FIG. 7 is a cross-sectional view that illustrates the architecture of a micromechanical resonator device of the present invention formed of two bonded Silicon-on-insulator (SOI) wafer elements.

FIG. 7 is a cross-sectional view that illustrates the architecture of a micromechanical resonator device 100 of the present invention formed of a SOI base plate 102 formed in a SOI base wafer 104 and a single crystal silicon micromechanical resonator 106 formed in a SOI resonator wafer 108 (shown in subsequent Figures and described below). The SOI base and resonator wafers are a type that is generally commercially available. The SOI base wafer element 104 includes a buried dielectric layer 110 having a typical thickness of from about 0.5 to 2.0 microns that is sandwiched between relatively thicker "handle" and "active" layers 112, 114 both of single crystal silicon (SCS) semiconductor material.

The resonator 106 is positioned above a capacitive air gap 116 in which the resonator 106 moves out of plane. The single crystal silicon resonator 106 is direct or fusion bonded at either end 118, 120 directly to single crystal silicon anchors 122, 124 formed in the active layer 114 of the base wafer 104, whereby it is coupled to the base plate 102 at both ends to provide a resonator of the clamped-clamped type. As was known in the prior art, such clamped-clamped type resonators achieve both small mass and high stiffness with relative ease. This is paramount for communications-grade resonators, since stiffness directly influences the dynamic range of circuits utilizing such resonators.

According to one embodiment of the invention, when the base wafer 104 is a SOI wafer, the resonator 106 is direct or fusion bonded to the SCS anchors 122, 124. Alternatively, the resonator 106 is frit bonded to the SCS anchors 122, 124 of the SOI base wafer 104.

According to another embodiment of the invention, when the base wafer 104 is an insulating substrate of the type described herein, the resonator 106 is anodic or frit bonded to the anchors 122, 124.

Single crystal silicon (SCS) semiconductor material for resonator 106 is a superior structural material for microresonators compared to polycrystalline films such as polysilicon and others due to lower internal friction and consequently higher mechanical Q, lower internal stress and an independence from various process parameters exhibited by SCS semiconductor material.

Figure 8:
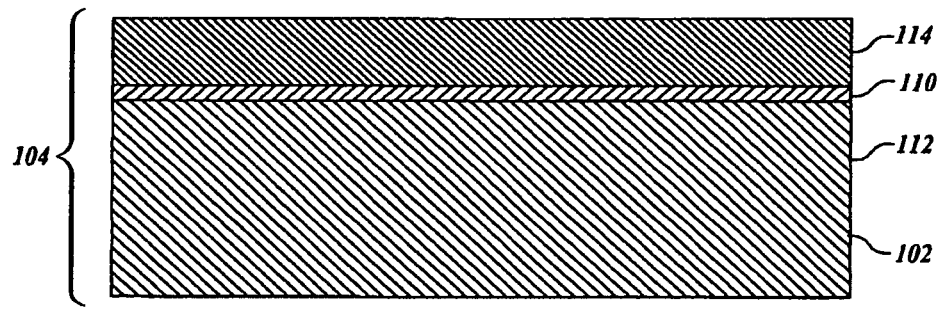
FIG. 8 is a cross-sectional view of a SOI base wafer element having a buried dielectric layer sandwiched between relatively thicker semiconductor material handle and thinner active layers.

FIG. 8 is a cross-sectional view of the SOI base wafer 104 having the buried dielectric layer 110 sandwiched between relatively thicker SCS semiconductor material handle and active layers 112, 114 whereof the SOI base plate 102 is formed.

Figure 9:
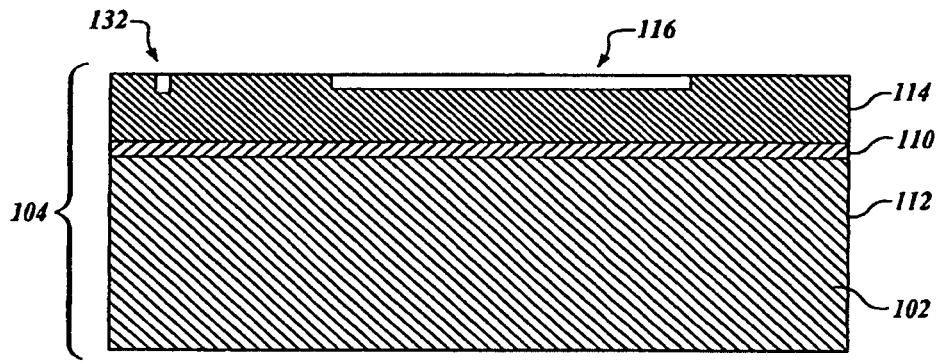
FIG. 9 is a cross-sectional view of a SOI base plate of the present invention and illustrates a capacitive air gap being formed in the active layer of the SOI base wafer element.

FIG. 9 is a cross-sectional view of the SOI base plate 102 and illustrates the alignment marks 132 created by photolithography and etching of SCS active layer 114. The alignment marks 132 are used for reference alignments on active layer 114, and for later alignment of the SOI resonator wafer 108. A capacitive air gap 116 is also formed in the active layer 114 of the SOI base wafer 104. This forming the capacitive air gap 116 in the active layer 114 is in direct contrast to prior art clamped-clamped, clamped-free, and free-free beam high frequency devices wherein the transducer capacitor gap spacing was determined by removal of a thin sacrificial layer. The active layer 114 is machined using, by example and without limitation, conventional photolithography masking and wet etching technology. Alternatively, the active layer 114 is machined using dry etching processes, such as either RIE (Reactive Ion Etch) or DRIE (Deep Reactive Ion Etch) processes. Such processes include, for example, the deep trench dry silicon etching processes commercially known as "BOSCH" and "ALCATEL" RIE and DRIE processes both obtain substantially vertical sidewalls of the etched features without concern for the crystallographic orientation of the etched substrate, whereby a more compact MEMS device results, which in turn enables more devices to be fabricated per wafer to produce a significant cost advantage.

By example and without limitation, the active layer 114 is machined using a silicon nitride deposition over which a photolithographic pattern is formed using photoresist masking material, followed by etching of the silicon nitride and stripping of the photoresist to create a silicon nitride mask over the active layer 114 with trenches forming the mask pattern. Silicon oxide is grown via thermal oxidation in the trenches. A silicon oxide/silicon nitride etch is performed to create the air gap 116 as a recess of very precise depth in the base plate active layer 114. The precision of the recess that forms the air gap 116 is more precise than using photoresist as sacrificial material. As contrasted with prior art wet etching methods, the method of the present invention is able to provide precise and very small capacitor air gaps 116 because the spacing is controlled by oxidation only, rather than wet etching of a photoresist. The depth of the air gap 116 is a function of design and performance parameters that are particular to the application. Precisely recessed air gaps 116 in the order of few Angstroms can be achieved using this technique. According to one embodiment of the present invention, the thermal oxidation and subsequent etching is used to create a recess of about 300 .ANG. in the base plate active layer 114.

Figure 10:
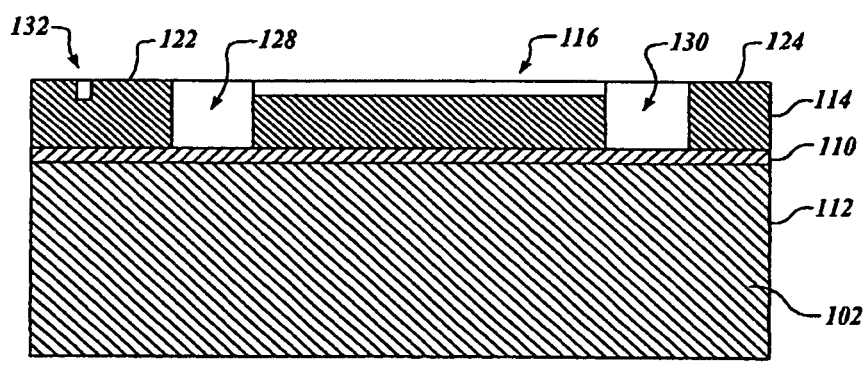
FIG. 10 is another cross-sectional view of the SOI base plate of the present invention and illustrates micromachining of the active layer of semiconductor material of the SOI base wafer element whereby mechanism features are formed.

FIG. 10 is another cross-sectional view of the SOI base plate 102 and illustrates micromachining of the active layer 114 of semiconductor material of the SOI base wafer element 104, whereby mechanism features are formed. For example, the resonator anchors 122, 124 are formed for supporting the resonator 106 relative to the air gap 116, and transmission lines 126 are also formed in a pattern structured to cooperate with the resonator 106. One or more isolation trenches 128, 130 are formed that reach to the buried dielectric layer 110 for electrically isolating the different anchors 122, 124 and RF transmission lines 126 of the mechanism features. The anchors 122, 124, transmission lines 126, and isolation trenches 128, 130 are formed by patterning of these features using photoresist mask material patterned by photolithography, which is followed by a silicon etch, such as RIE or DRIE, stopping at the buried oxide dielectric layer 110 in the SOI base wafer 104. The photoresist mask material is then removed and the resulting SOI base plate 102 is cleaned.

Figure 11:
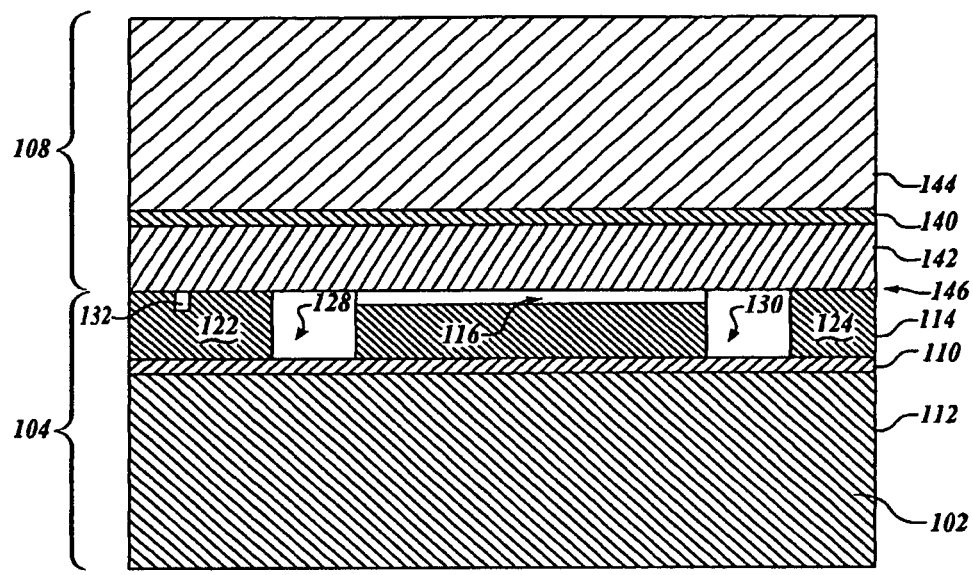
FIG. 11 is a side view of the SOI base plate of the present invention with a SOI resonator wafer element emplaced.

FIG. 11 is a side view of the SOI base wafer 104 fusion bonded with the SOI resonator wafer 108 and placed. The SOI resonator wafer element 108 includes a buried dielectric layer 140 having a thickness of from about 0.4 or thinner to about 2.0 microns that is sandwiched between relatively thicker "active" and "handle" layers 142, 144 both of semiconductor material.

In an as yet unpatterned state, the SOI resonator wafer 108 is flipped vertically and, having the active layer 142 facing the active layer 114 of the SOI base wafer 104 having the resonator anchor features 122, 124 separated by the capacitive air gap feature 116, the RF transmission line features 126, isolation trench features 128, 130 and alignment marks feature 132. The unpatterned and flipped SOI resonator wafer 108 is flat aligned with the SOI base wafer 104 using major or minor flats of both wafers. The SOI resonator wafer 108 requires flat alignment only because it is as yet unpatterned so that the precision alignment required of prior art methods is not necessary.

Figure 12:
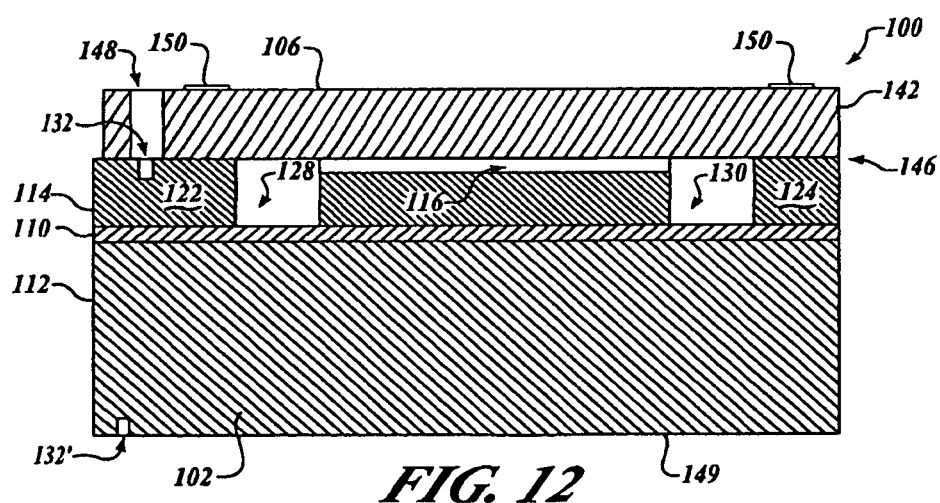
FIG. 12 is a cross-sectional view of the micromechanical resonator device of the present invention having the SOI resonator wafer element being machined to develop the micromechanical silicon resonator and supplemental operational features as may be required.

FIG. 12 is a cross-sectional view of the micromechanical resonator device 100 of the present invention having the SOI resonator wafer 108 micromachined to develop the micromechanical silicon resonator 106 and supplemental operational features as may be required. The handle layer 144 and internal oxide dielectric layer 140 are stripped from the active layer 142 of the SOI resonator wafer element 108. According to one embodiment of the invention, using photolithography and silicon etching, one or more windows 148 are etched to open access to alignment marks 132 on active layer 114 of base wafer 104. The windows 148 are larger than the alignment marks 132 and in alignment therewith. The alignment marks 132 are used for subsequent photolithography alignment steps for SOI resonator wafer active layer 142.

While alignment windows result in better alignment accuracy, alignment is optionally accomplish by another method. Alternatively, for example, alignment marks 132' are formed in the backside 149 of the SOI base wafer 102 and used for front to back alignment. Next steps include phosphorous doping of the active layer 142 at selected locations of one or more contact pads 150, which is followed by conventional metal deposition for depositing a metal, such as gold and aluminum, to create contact pads 150 and metal, such as gold or aluminum, deposition on backside of base wafer 104 for grounding.

Using the viewing windows 148 to align relative to the alignment marks 132 on the SOI resonator wafer element 108, or another alignment method, the active layer 142 is patterned with photoresist masking material by photolithography. Accordingly, the requirement in prior art methods for a precise fusion bond alignment is eliminated. The active layer 142 is silicon dry etched using either RIE or DRIE machining to define the single crystal silicon resonator 106 in the active layer 142. Thus, in contrast to prior art methods of releasing the resonator, the present invention does not require a wet etch release because a sacrificial layer is not being removed to release the silicon resonator 106 of the invention. The photoresist masking material is dry stripped, whereupon the micromechanical resonator device 100 is free.

When joined by fusion or direct bonding, the interface 146 couples the single crystal silicon resonator 106 to the single crystal silicon anchor features 122, 124 of the SOI base plate 102. Thus, according to any embodiment of the invention, the resonator 106 is formed of single crystal silicon. Accordingly, several advantages over the prior art are realized by the invention. The device resonator 106 is a single crystal silicon. As contrasted with the polysilicon resonators of the prior art, the single crystal resonator 106 results in higher Q and has none of the impurities present in polycrystalline silicon or "polysilicon" thin films or other material thin films to degrade device performance. The use of single crystal silicon for the resonator 106 also eliminates both the intrinsic stresses and the stress gradients that effect performance of prior art devices based upon polycrystalline silicon resonators, which is a critical attribute for devices used in applications that require high repeatability and reproducibility. The dry etch release of the resonator 106 and complementary dry stripping of the photoresist masking material eliminate the prior art methods of sacrificial surface wet etch micromachining that complicate the prior art manufacturing process and generally results in low yield because of the difficulty in removing the sacrificial material in the small gap between the resonator and the lower electrode and results in stiction or adhesion, which further lowers yields. Rather, in contrast to the prior art methods, forming the capacitive air gap 116 in the active layer 114 of the base wafer 104 results in precise depth control and very small capacitor air gaps 116. Micromachining of the resonator 106 with the active layer 142 of the flipped SOI resonator wafer 108 in place on the base plate 102 eliminates the precise fusion bond alignment necessary, and replaces it with the simpler flat alignment only visually through the viewing windows 148.

According to embodiments of the invention wherein the base wafer 104 is a single crystal silicon SOI wafer, which results in single crystal silicon anchors 122, 124 that are more rigid than anchors known in the prior art. When joined by fusion bonding, the interface 146 couples the resonator 106 into a single crystal silicon with the anchor features 122, 124 of the SOI base plate 102. Thus, according to this fusion bonded embodiment of the invention, the resonator 106 and anchors 122, 124 are joined in an integrated unit formed of uniform single crystal silicon. Accordingly, additional advantages over the prior art are realized by this fusion bonded embodiment of the invention. The device resonator 106 is integral with the supporting anchors 122, 124 so that the interface stresses of the prior art devices arising from material and thermal expansion coefficient differences are eliminated. Thus, as contrasted with the polysilicon resonator beams of the prior art, the integral single crystal resonator 106 and supporting anchors 122, 124 of the present invention eliminates the thermal gradients and intrinsic stresses at the interface of the polycrystalline silicon resonator and the underlying silicon support anchors that occur in prior art devices and degrade device performance.

Figure 13:
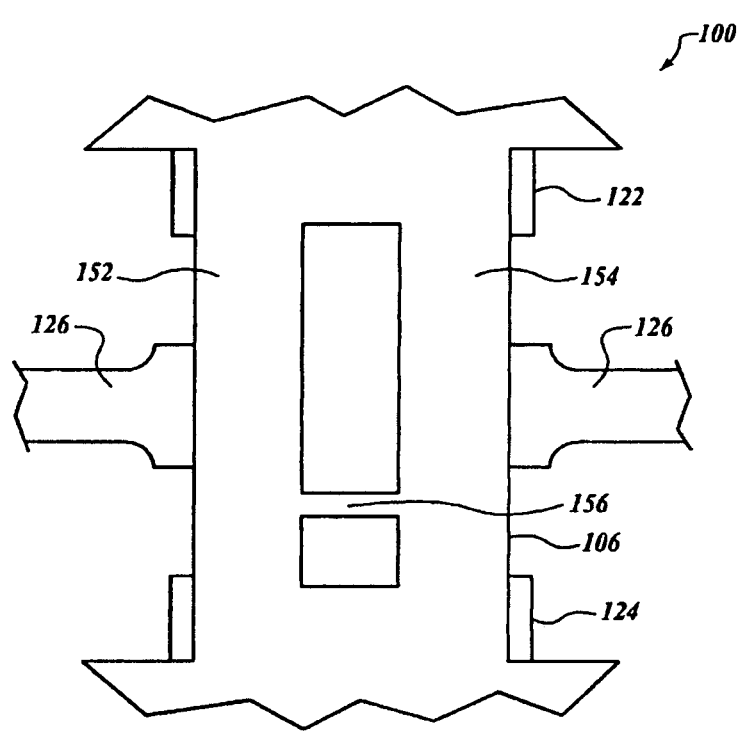
FIG. 13 is a plan view of a portion of one device of the present invention having a single crystal silicon resonator embodied as a clamped-clamped dual beam resonator having first and second single crystal silicon resonator beams connected with a coupling beam to form a filter device.

FIG. 13 is a plan view of a portion of one exemplary device 100 of the present invention having a single crystal silicon resonator 106 embodied as a clamped-clamped dual beam resonator having first and second single crystal silicon resonator beams 152, 154 connected with a coupling beam 156 to form a filter device. According to the method of the present invention, the first and second resonator beams 152, 154 are coupled to the single crystal silicon support anchors 122, 124 of the SOI base plate 102 by either fusion, anodic or eutectic bonding, whereby the device 100 is able to simultaneously achieve high-Q and high stiffness, which is paramount for communications-grade resonators.

Alternatively, the single crystal silicon resonator 106 is embodied as a single crystal silicon clamped-free resonator beam, a free-free resonator beam, or a single crystal silicon membrane or disk.

According to one embodiment of the present invention, the clamped-clamped resonator 106 is an interconnected dual resonator that is structured for operation as a filter device.

According to a different embodiment of the present invention, the single crystal silicon wafer mechanical resonator 106 is structured as a clamped-free interconnected dual beam resonator that is structured for operation as a filter device.

Alternatively, the single crystal silicon wafer mechanical resonator 106 is structured as a free-free interconnected dual beam resonator that is structured for operation as a filter device.

Alternatively, the single crystal silicon wafer mechanical resonator 106 is structured as a single disk or multidisk interconnected resonator that is structured for operation as a filter device.

According to different embodiments of the present invention, the active layer 142 of the SOI resonator wafer 108 is fusion bonded to the active layer 114 of the SOI base wafer element 104 into a single substrate that is micromachined to produce the resonator 106, by example and without limitation the first and second single crystal silicon resonator beams 152, 154, which are integral with the single crystal silicon support anchors 122, 124 of the SOI base plate 102. The resulting device 100 provides all the advantages over the prior art of a single crystal silicon resonator, and also provides the added advantages inherent in forming the resonator beams 152, 154 and support anchors 122, 124 of a single integrated substrate.

According to different embodiments of the present invention, the base wafer 104 is an insulating wafer-type substrate, wherein the air gap 116 and alignment marks 132, 132' are etched via bulk micro aching using wet and/or dry etching techniques in the insulating substrate. Transmission lines are formed using metal deposition in etched cavities on the substrate, for example, via E-beam metal deposition or sputtering. The glass or insulating wafer-type substrate is optionally bonded to the beam SOI wafer 108 using anodic or frit bonding. Such embodiments also result in the resonator 106 being of single crystal silicon, whereby the advantages discussed herein are realized.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method forming a vibrating micromechanical structure, the method comprising:
   micromachining one or more resonator structure anchors, a capacitive air gap, one or more isolation trenches, and one or more alignment marks in a single crystal silicon semiconductor material active layer of a first Silicon-On-Insulator wafer having a dielectric layer between a semiconductor material handle layer and the semiconductor material active layer;
   fusion bonding a single crystal silicon semiconductor material active layer of a second Silicon-On-Insulator wafer directly to the active layer of the first Silicon-On-Insulator wafer, the second Silicon-On-Insulator wafer having a dielectric oxide layer between a second semiconductor material handle layer and the semiconductor material active layer;
   removing the second semiconductor material handle layer and dielectric oxide layers of the second Silicon-On-Insulator wafer;
   etching one or more windows in the active layer of the second Silicon-On-Insulator wafer; and
   silicon dry etch micromachining a single crystal silicon resonator structure in the single crystal silicon semiconductor material active layer of the second Silicon-On-Insulator wafer.

2. The method of claim 1 wherein silicon dry etch micromachining the single crystal silicon resonator structure in the single crystal silicon semiconductor material active layer of the second Silicon-On-Insulator wafer further comprises aligning a mask relative to the one or more alignment marks in the active layer of the first Silicon-On-Insulator wafer.

3. The method of claim 1 wherein silicon dry etch micromachining the single crystal silicon resonator structure in the single crystal silicon semiconductor material active layer of the second Silicon-On-Insulator wafer further comprises micromachining the single crystal silicon resonator structure using one of reactive ion etching and deep reactive ion etching.

4. The method of claim 3 wherein micromachining the single crystal silicon resonator structure further comprises initially masking the single crystal silicon semiconductor material active layer of the second Silicon-On-Insulator wafer with photoresist material and subsequently dry stripping the photoresist material.

5. The method of claim 1 wherein micromachining one or more of the resonator structure anchors, the capacitive air gap, one or more of the isolation trenches, and one or more of the alignment marks in the single crystal silicon semiconductor material active layer of a first Silicon-On-Insulator wafer further comprises micromachining using a conventional photolithography masking and wet etching micromachining method.

6. The method of claim 1 wherein silicon dry etch machining the single crystal silicon resonator structure in the single crystal silicon semiconductor material active layer of the second Silicon-On-Insulator wafer further comprises machining the single crystal silicon resonator structured as one of: a clamped-clamped resonator beam, a clamped-free resonator beam, a free-free resonator beam, a single crystal silicon membrane, and a single crystal silicon disk.

7. The method of claim 6, further comprising micromachining one or more RF transmission lines in the active layer of the first Silicon-On-Insulator wafer; and wherein machining the single crystal silicon resonator structure further comprises machining a single crystal silicon resonator structure that is structured to form a filter device.

* * * * *